(12) United States Patent
Nakashiba

(10) Patent No.: US 8,513,783 B2
(45) Date of Patent: Aug. 20, 2013

(54) SEMICONDUCTOR DEVICE

(71) Applicant: Renesas Electronics Corporation, Kanagawa (JP)

(72) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/760,812

(22) Filed: Feb. 6, 2013

(65) Prior Publication Data

US 2013/0147010 A1    Jun. 13, 2013

Related U.S. Application Data

(62) Division of application No. 13/026,669, filed on Feb. 14, 2011, now Pat. No. 8,415,776, which is a division of application No. 12/018,245, filed on Jan. 23, 2008, now Pat. No. 7,928,539.

(30) Foreign Application Priority Data

Jan. 29, 2007   (JP) .................................. 2007-18239

(51) Int. Cl.
  *H01L 23/48*     (2006.01)
(52) U.S. Cl.
  USPC ............................ 257/664; 257/758; 257/773
(58) Field of Classification Search
  USPC ................... 257/531, E23.141, 664, E23.142, 257/758, 773, 786; 438/567
  See application file for complete search history.

(56) References Cited

U.S. PATENT DOCUMENTS

| | | | |
|---|---|---|---|
| 6,730,983 B2 | 5/2004 | Minami | |
| 7,161,248 B2 | 1/2007 | Karasawa et al. | |
| 7,262,481 B1 * | 8/2007 | Marques | 257/531 |
| 7,339,256 B2 | 3/2008 | Nakamura et al. | |
| 2005/0167842 A1 | 8/2005 | Nakamura et al. | |
| 2005/0233564 A1 | 10/2005 | Kitada et al. | |
| 2006/0163692 A1 | 7/2006 | Detecheverry et al. | |
| 2007/0228515 A1 | 10/2007 | Asahi | |

FOREIGN PATENT DOCUMENTS

| | | |
|---|---|---|
| CN | 1670953 | 9/2005 |
| JP | 2002-110908 | 4/2002 |
| JP | 2005-285970 | 10/2005 |
| JP | 2005-310807 | 11/2005 |
| JP | 2006-528837 | 12/2006 |
| JP | 2007-273577 | 10/2007 |

OTHER PUBLICATIONS

Japanese Official Action—2008-016642—Oct. 2, 2012.
Chinese Office Action issued Feb. 2, 2012 by the State Intellectual Property Office of the People's Republic of China in the corresponding Chinese application No. 200810008603.0, 8 pages.
Hajimiri et al., "Design Issues in CMOS Differential LC Oscillators," IEEE J. of Solid-State Circ. vol. 34, No. 5, pp. 717-724 (May 1999).

* cited by examiner

*Primary Examiner* — S. V. Clark
*Assistant Examiner* — Krista Soderholm
(74) *Attorney, Agent, or Firm* — Young & Thompson

(57) ABSTRACT

A semiconductor device (1) includes a wiring (10) and dummy conductor patterns (20). The wiring (10) is a wiring through which a current with a frequency of 5 GHz or higher flows. Near the wiring (10), the dummy conductor patterns (20) are formed. A planar shape of each of the dummy conductor patterns (20) is equivalent to a shape with an internal angle larger than 180°.

9 Claims, 12 Drawing Sheets

SEMICONDUCTOR DEVICE

BACKGROUND OF THE INVENTION

1. Field of the Invention

The present invention relates to a semiconductor device.

2. Description of the Related Art

FIG. 9 is a plan view showing a semiconductor device of a related art (for example, see JP 2005-310807 A). In a semiconductor device 100, rectangular dummy conductor patterns 102 are formed near a wiring 101. The dummy conductor patterns 102 are provided so that the wiring 101 can be easily processed at the time of production of the semiconductor device 100. In addition, the wiring 101 functions as an inductor.

Note that, related art documents relevant to the present invention include JP 2005-285970 A and Ali Hajimiri et al., "Design Issues in CMOS Differential LC Oscillators", IEEE JOURNAL OF SOLID-STATE CIRCUITS, V01. 34, No. 5, May 1999, pp. 717-724, in addition to JP 2005-310807 A.

The present inventor has recognized as follows. In a case where a high-frequency current flows through the wiring 101 in the semiconductor device 100 shown in FIG. 9, the following problem arises. That is, as shown in FIG. 10, by a magnetic field generated by the wiring 101, an eddy current is generated in each of the dummy conductor patterns 102 positioned near the wiring 101. FIG. 10 is a plan view of an enlarged portion surrounded by the dotted line of FIG. 9. A direction of the current flowing through the wiring 101 is indicated by an arrow A1 of FIG. 10, and a direction of the eddy current flowing in the dummy conductor pattern 102 is indicated by an arrow A2 of FIG. 10.

When the eddy current is generated as described above, according to Lentz's law, a magnetic field in a direction in which the magnetic field generated by the wiring 101 is offset is generated. Accordingly, a circuit constant of the wiring 101 fluctuates, which results in instability of transmission characteristics of the wiring 101. The problem becomes prominent when the high-frequency current with a frequency of 5 GHz or higher flows through the wiring 101.

SUMMARY

A semiconductor device according to an aspect of the present invention includes: a wiring; and first dummy conductor patterns formed near the wiring, in which a planar shape of each of the first dummy conductor patterns is equivalent to a shape with an internal angle larger than 180°.

In the semiconductor device, the first dummy conductor patterns formed near the wiring each have an internal angle larger than 180° in plan view. The presence of the internal angle leads to an increase in complexity of the shape of the first dummy conductor pattern. In a case where a signal flowing through the wiring is a high-frequency signal, due to a skin effect, a current density thereof is increased as the current density comes closer to a surface of a conductor. Accordingly, the complexity of an outer shape of the first dummy conductor pattern effectively inhibits a flow of the eddy current in the pattern. As a result, the eddy current decreases in magnitude, whereby the fluctuation of the circuit constant of the wiring can be suppressed to a small level.

A semiconductor device according to another aspect of the Present invention includes an interconnection conductor and a plurality of dummy conductor patterns arranged around the interconnection conductor, each of the dummy conductor patterns has a polygonal shape with at least one dent which is provided at a part of a periphery of the polygonal shape.

In the semiconductor device, each of the dummy conductor patterns arranged around the interconnection conductor has a polygonal shape with at least one dent which is provided at a part of a periphery of the polygonal shape. The presence of dent which is provided at a part of a periphery of the polygonal shape leads to an increase in complexity of the shape of the dummy conductor pattern. in a case where a signal flowing through the interconnection conductor is a high-frequency signal, due to the skin effect, the current density thereof is increased as the current density comes closer to the surface of the conductor. Accordingly, the complexity of the outer shape of the first dummy conductor pattern effectively inhibits the flow of the eddy current in the pattern. As a result, the eddy current decreases in magnitude, whereby the fluctuation of the circuit constant of the inductor can be suppressed to a small level.

According to the present invention, there can be achieved a semiconductor device capable of improving stability of transmission characteristics of wiring.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Hereinafter, exemplary embodiments of the present invention will be described in detail with reference to the accompanying drawings. Note that, in the description of the drawings, the same components are denoted by the same reference symbols, and redundant explanations thereof are omitted.

Figure 1:
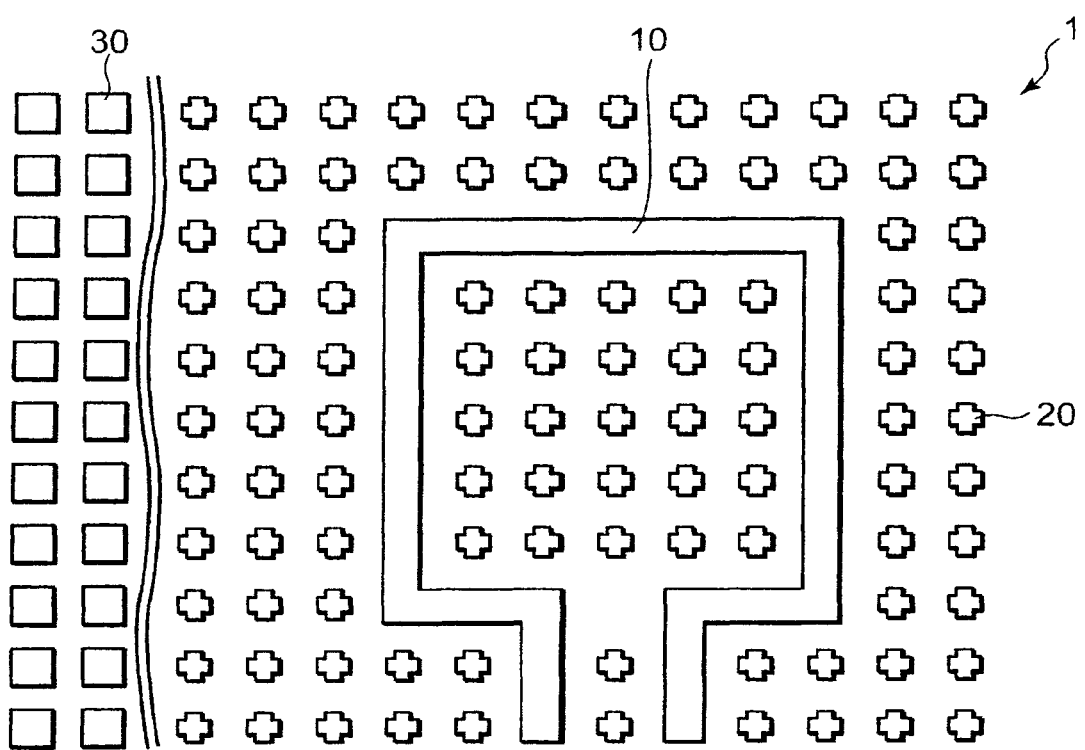
FIG. 1 is a plan view showing a semiconductor device according to an embodiment of the present invention.

FIG. 1 is a plan view showing a semiconductor device according to an embodiment of the present invention. A semiconductor device 1 includes a wiring 10 and dummy conductor patterns 20. The wiring 10 is a wiring through which a high-frequency current with a frequency of 5 GHz or higher flows. In the embodiment of the present invention, the wiring 10 functions as an inductor.

Near the wiring 10, a plurality of dummy conductor patterns 20 are formed. In this case, the dummy conductor pattern refers to a conductor pattern, presence or absence of which does not affect a circuit configuration of the semiconductor device 1. The dummy conductor patterns 20 are arranged regularly, in particular, in a tetragonal lattice shape. The dummy conductor patterns 20 are each made of the same material as that of the wiring 10. Examples of the material include copper and aluminum. In a case where the wiring 10 and the dummy conductor patterns 20 are each made of copper, the wiring 10 and the dummy conductor patterns 20 are each formed by, for example, a damascene process. Note that the wiring 10 and the dummy conductor patterns 20 may be formed in the same layer or may be formed in different layers. In the former case, it is preferable that the wiring 10 and the dummy conductor patterns 20 be formed at the same time.

Figure 2:
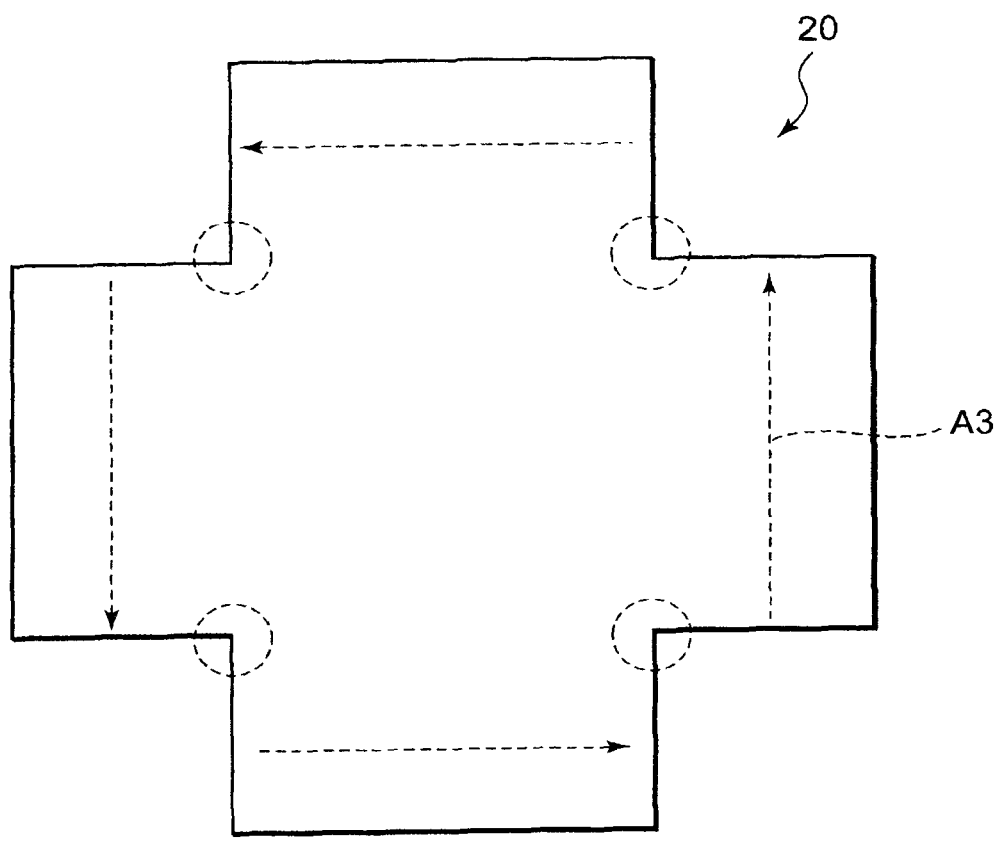
FIG. 2 is a plan view showing a dummy conductor pattern formed near a wiring.
Figure 3:
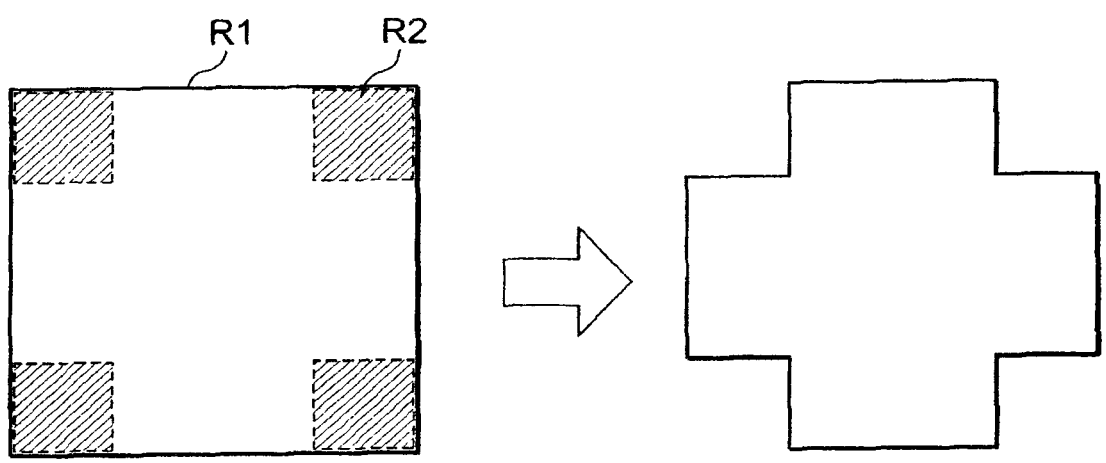
FIG. 3 is a plan view for explaining a planar shape of the dummy conductor pattern of FIG. 2.

FIG. 2 is a plan view showing the dummy conductor pattern 20. A planar shape of the dummy conductor pattern 20 is equivalent to a shape with an internal angle larger than 180°. As shown in FIG. 3, the planar shape of the dummy conductor Pattern 20 is equivalent to a shape obtained by removing, from a first rectangle R1, second rectangles R2 (port ions indicated by oblique lines). The first rectangle R1 can be defined as a shape with a smallest area among rectangles capable of including the dummy conductor pattern 20. The second rectangles R2 are positioned at corner portions of the first rectangle R1, and each have an area smaller than that of the first rectangle R1. In the embodiment of the present invention, all the four corner portions of the first rectangle R1 are removed. As a result, the planar shape of the dummy conductor pattern 20 becomes equivalent to a shape with four internal angles (portions surrounded by circles shown in FIG. 2) of 270°. In other words, the dummy conductor pattern 20 has a cross shape in plan view. Note that a size of the dummy conductor pattern 20 (length of one side of the first rectangle R1) is, for example, about 1 μm.

Returning to FIG. 1, the semiconductor device 1 further includes a plurality of dummy conductor patterns 30. The dummy conductor patterns 30 are formed in a region near the wiring 10, that is, out of a region in which the dummy conductor patterns 20 are formed. Accordingly, the dummy conductor patterns 30 are formed at positions far from the wiring 10 as compared with the dummy conductor patterns 20. A planar shape of each of the dummy conductor patterns 30 is equivalent to a rectangle. A data ratio in the region in which the dummy conductor patterns 20 are formed is smaller than a data ratio in the region in which the dummy conductor patterns 30 are formed. In this case, the data ratio refers to an area ratio of a conductor in a given region (in-plain region in parallel with substrate).

A factor in the difference in data ratio between the regions is that the planar shape of each of the dummy conductor patterns 20 is equivalent to the shape obtained by removing part of the rectangle as described above. The data ratio in the region in which the dummy conductor patterns 20 are formed becomes smaller by an amount of the removed portions. However, even if the planar shape of each of the dummy conductor patterns 20 is a rectangle, it is preferable that the above-mentioned magnitude of correlation regarding the data ratio be established. In other words, even when the dummy conductor patterns 20 and the dummy conductor patterns 30 each have a rectangular shape, it is preferable that the dummy conductor patterns 20 and 30 be formed so that the data ratio of the former case becomes smaller than that of the latter case.

Effects of the embodiment of the present invention will be described. In the semiconductor device 1, the dummy conductor patterns 20 formed near the wiring 10 each have an internal angle larger than 180° in plan view. The presence of the internal angle leads to an increase in complexity of the shape of each of the dummy conductor patterns 20. In the case of the high-frequency current, due to the skin effect, the current density is increased as the current density comes closer to the surface of the conductor. Accordingly, the complexity of the outer shape of the dummy conductor pattern 20 effectively inhibits the flow of the eddy current (indicated by arrows A3 shown in FIG. 2) in the pattern. Accordingly, the eddy current decreases in magnitude, whereby the fluctuation of the circuit constant of the wiring 10 can be suppressed to a small level. As a result, the semiconductor device 1 capable of improving the stability of the transmission characteristics of the wiring 10 is achieved.

According to the skin effect, a current density J in a conductor is represented by the following formula (1).

$$J(\delta) = \exp(-\delta/d) \quad (1)$$

where δ represents a depth from the surface of the conductor, and d represents a skin depth.

The skin depth d corresponds to the depth δ obtained when the current density J becomes 1/e (about 0.37) times larger than a current (=J(0)) at the surface, and is obtained by the following formula (2).

$$d = \{(2\rho)/(\omega\mu)\}^{1/2} \quad (2)$$

where ρ represents an electric resistivity of the conductor, ω represents an angular frequency of the current, and μ represents an absolute permeability of the conductor.

For example, in a case of copper (conductivity σ=5.80×10$^7$ [S/m]), the skin depth d is 2.1 μm at a frequency of 1 GHz, 0.95 μm at a frequency of 5 GHz, and is 0.66 μm at a frequency of 10 GHz. In a case of aluminum (conductivity σ=3.6×10$^7$ [S/m]), the skin depth d is 2.65 μm at a frequency of 1 GHz, 1.2 μm at a frequency of 5 GHz, and is 0.839 μm at a frequency of 10 GHz.

Further, in the embodiment of the present invention, the dummy conductor patterns 20 each have an internal angle of 270° in plan view. With the internal angle of 270°, each of the dummy conductor patterns 20 can be depicted using only two kinds of sides, that is, a side in parallel with an X-direction (horizontal direction of FIG. 2) and a side in parallel with a Y-direction (vertical direction of FIG. 2) Accordingly, the dummy conductor patterns 20 can be easily formed, and eventually, production of the semiconductor device 1 can be facilitated.

The dummy conductor patterns 20 each have a shape obtained by removing all the four rectangular corners thereof. As a result, the dummy conductor patterns 20 each have four internal angles larger than 180°, whereby an inhibition effect of the eddy current is further increased. In addition, the dummy conductor patterns 20 each have a cross shape in plan view. In view of an operation of the dummy conductor patterns 20 facilitating the processing of the wiring 10, it is preferable that the dummy conductor patterns 20 each have a high degree of symmetrical property in shape as described above.

The data ratio in the region in which the dummy conductor patterns 20 are formed is smaller than that in the region in which the dummy conductor patterns 30 are formed. The reduction in ratio of the conductors (dummy conductor patterns 20) formed near the wiring 10 also contributes to the suppression in eddy current generated by the magnetic field of the wiring 10.

The wiring 10 according to the embodiment of the present invention is an inductor. In this case, a magnetic field in a direction in which the magnetic field of the inductor is offset by the eddy current is generated, which results in reduction in strength of the magnetic field of the inductor. The reduction in strength of the magnetic field leads to deterioration of a Q factor of the inductor. In this regard, according to the embodiment of the present invention, the eddy current can be suppressed as described above, whereby the deterioration of the Q factor can be suppressed to a small level.

Figure 4:
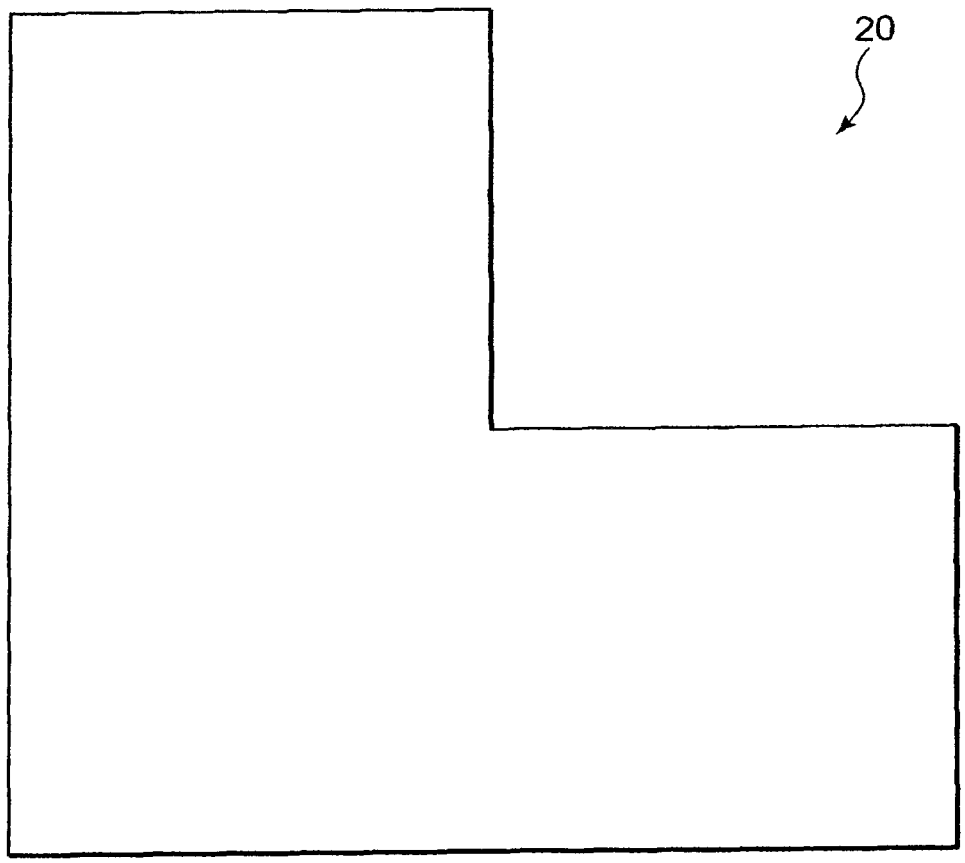
FIG. 4 is a plan view showing a dummy conductor pattern according to a modified example of the present invention.
Figure 5:
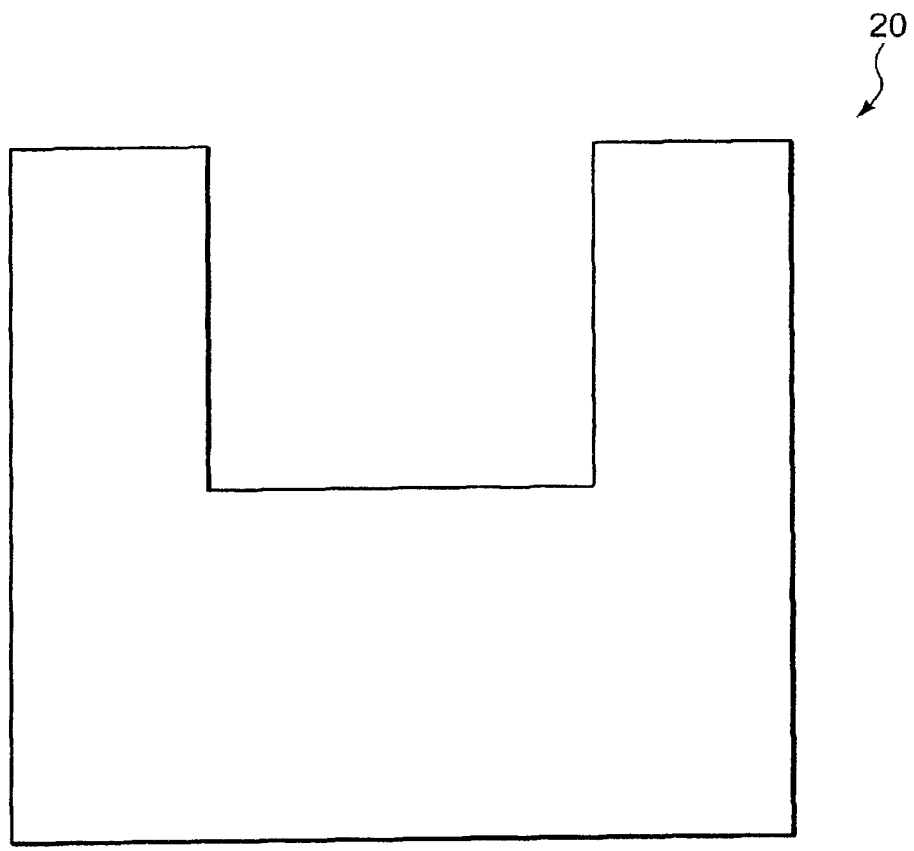
FIG. 5 is a plan view showing a dummy conductor pattern according to another modified example of the present invention.
Figure 6:
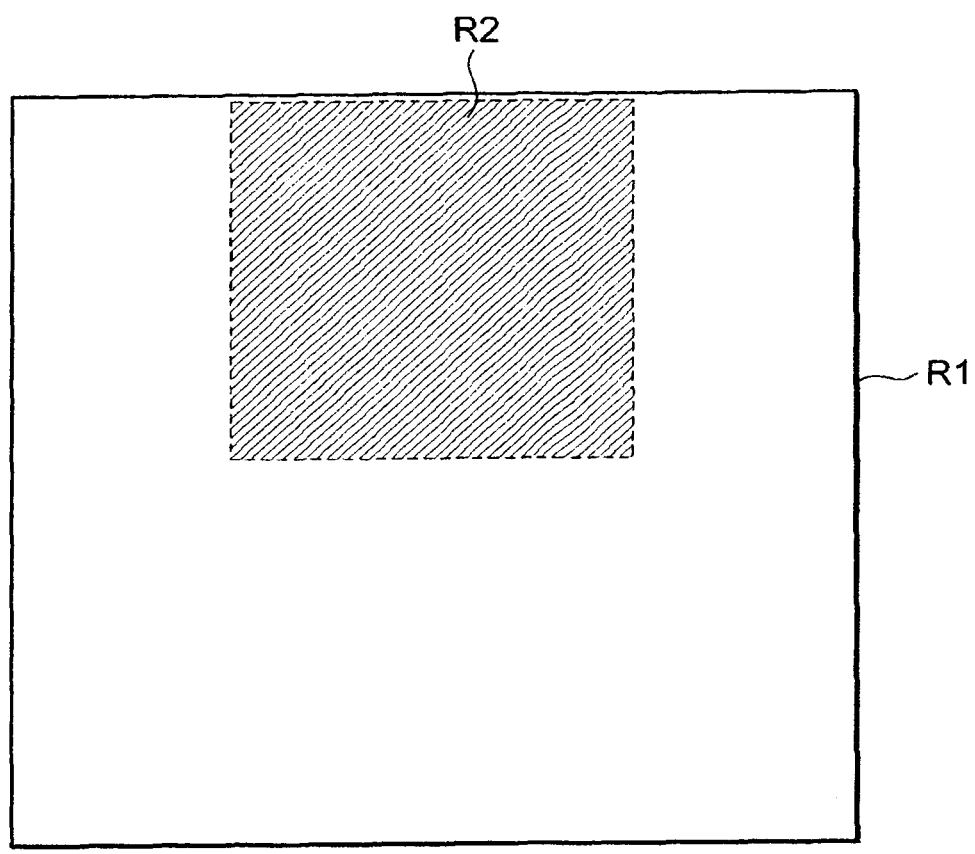
FIG. 6 is a plan view for explaining a planar shape of the dummy conductor pattern of FIG. 5.

Although the present invention has been described above in connection with several preferred embodiments thereof, it is apparent that the present invention is not limited to the above embodiments, and may be modified and changed without departing from the scope and spirit of the invention. The planar shape of the dummy conductor pattern 20 is not limited to the shapes illustrated in the above embodiment, but in addition, various shapes can be used. For example, the planar shape of the dummy conductor pattern 20 may be an L-shape as shown in FIG. 4, or may be a U-shape as shown in FIG. 5. The planar shapes of the dummy conductor pattern 20 as shown in FIGS. 4 and 5 are equivalent to shapes obtained by removing, from a first rectangle, a second rectangle having an area smaller than that of the first rectangle, in the same manner as in the dummy conductor pattern 20 shown in FIG. 2. In particular, in the dummy conductor pattern 20 shown in FIG. 5, one side of the second rectangle R2 is in contact with one side of the first rectangle R1 as shown in FIG.

Figure 7:
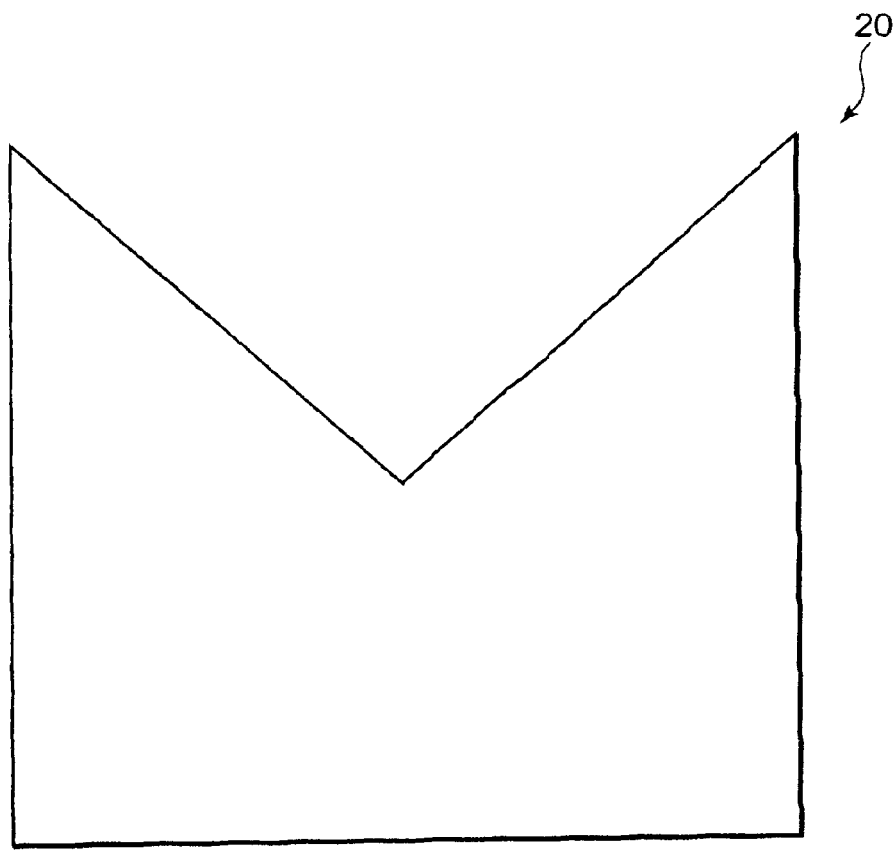
FIG. 7 is a plan view showing a dummy conductor pattern according to still another modified example of the present invention.

Alternatively, the dummy conductor pattern 20 may have a planar shape as shown in FIG. 7. This shape is equivalent to a shape obtained by removing a triangle from a rectangle. In addition, the dummy conductor pattern 20 may have at least one internal angle θ which satisfies 180°<θ<360°, and the internal angle θ is not limited to 270°.

Figure 8:
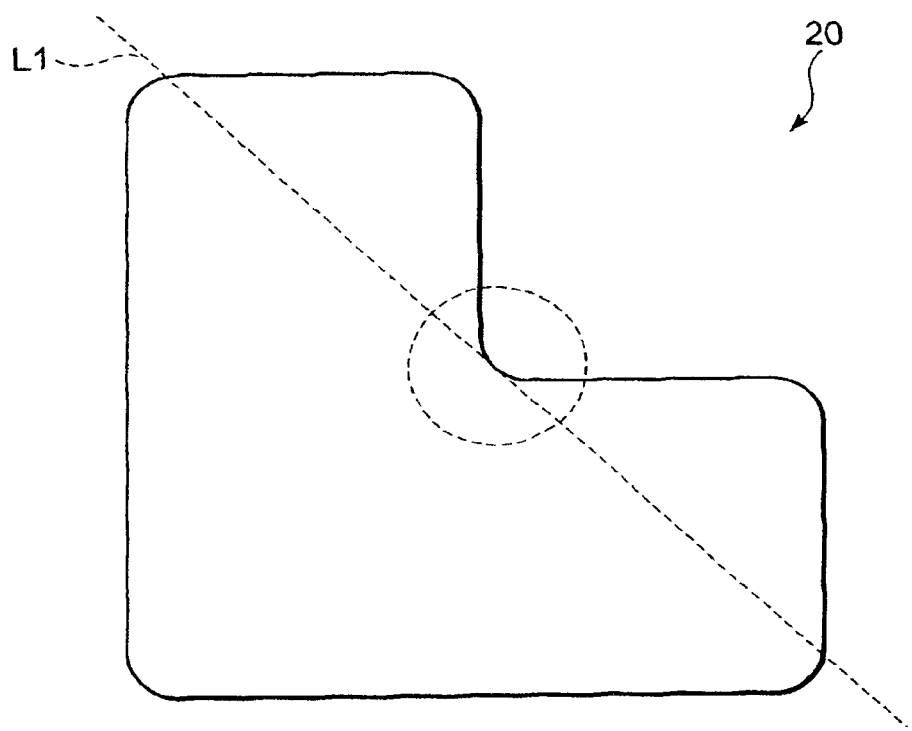
FIG. 8 is a plan view showing an example of a shape of the dummy conductor pattern of FIG. 4 after being processed.
Figure 9:
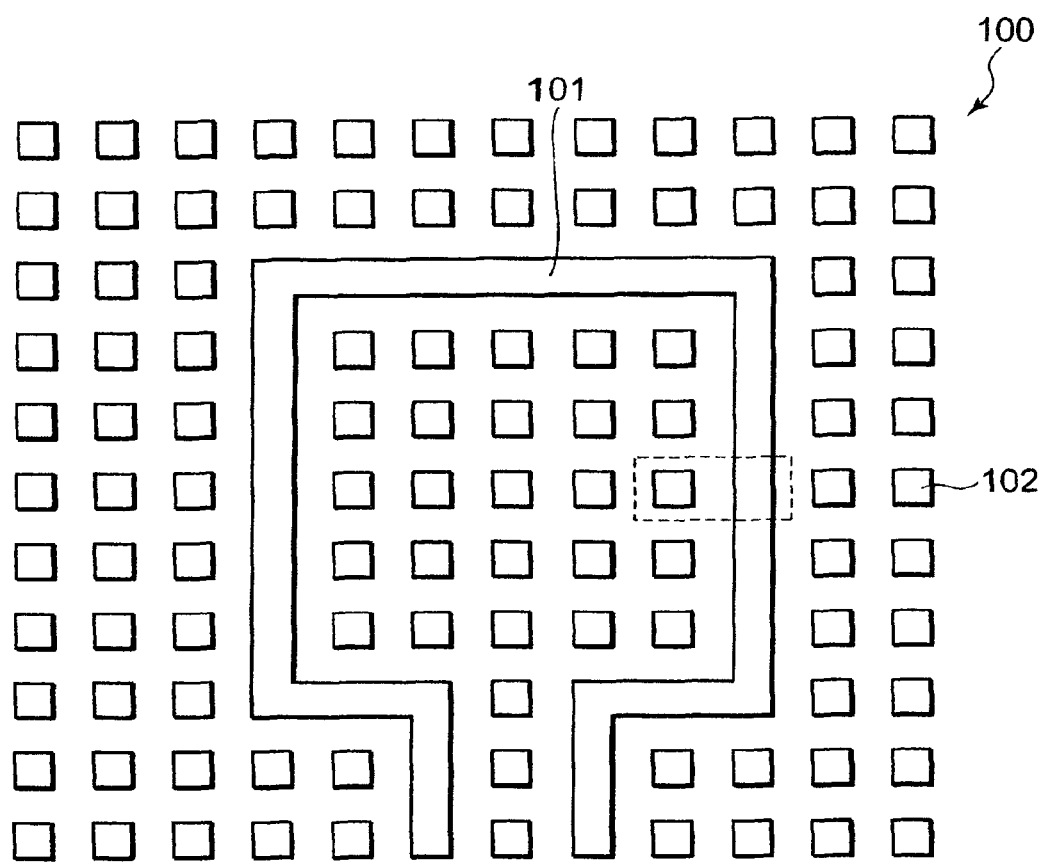
FIG. 9 is a plan view showing a semiconductor device of a related art.
Figure 10:
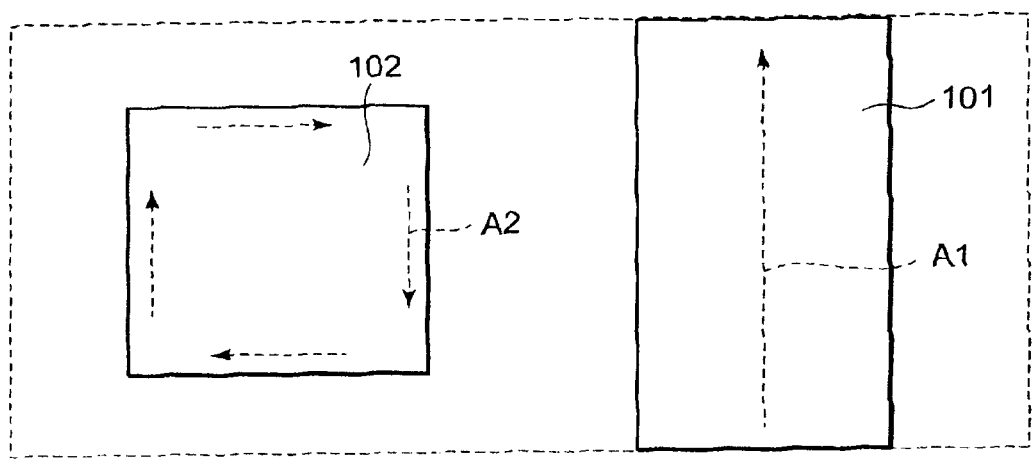
FIG. 10 is a plan view for explaining a problem of the semiconductor device of the related art.

Note that the shapes shown in FIGS. 2, 4, 5, and 7 are ideal shapes in a design phase of the dummy conductor pattern 20. In general, corner portions in the design phase become rounded shapes after being actually processed. FIG. 8 shows an example of the shape of the dummy conductor pattern 20 of FIG. 4 obtained after being processed. In the specification of the present invention, the shape as shown in FIG. 8 is also included in the category of "shape with an internal angle larger than 180°". In the shape with no precise angle as in the example, a portion at which a tangential line L1 passing through an inside of the shape can be drawn (portion surrounded by a circle) is regarded as the internal angle larger than 180°.

Further, in the embodiment of the present invention, the case where the wiring 10 is an inductor is illustrated, but a typical wiring may be used as the wiring 10.

Figure 11:
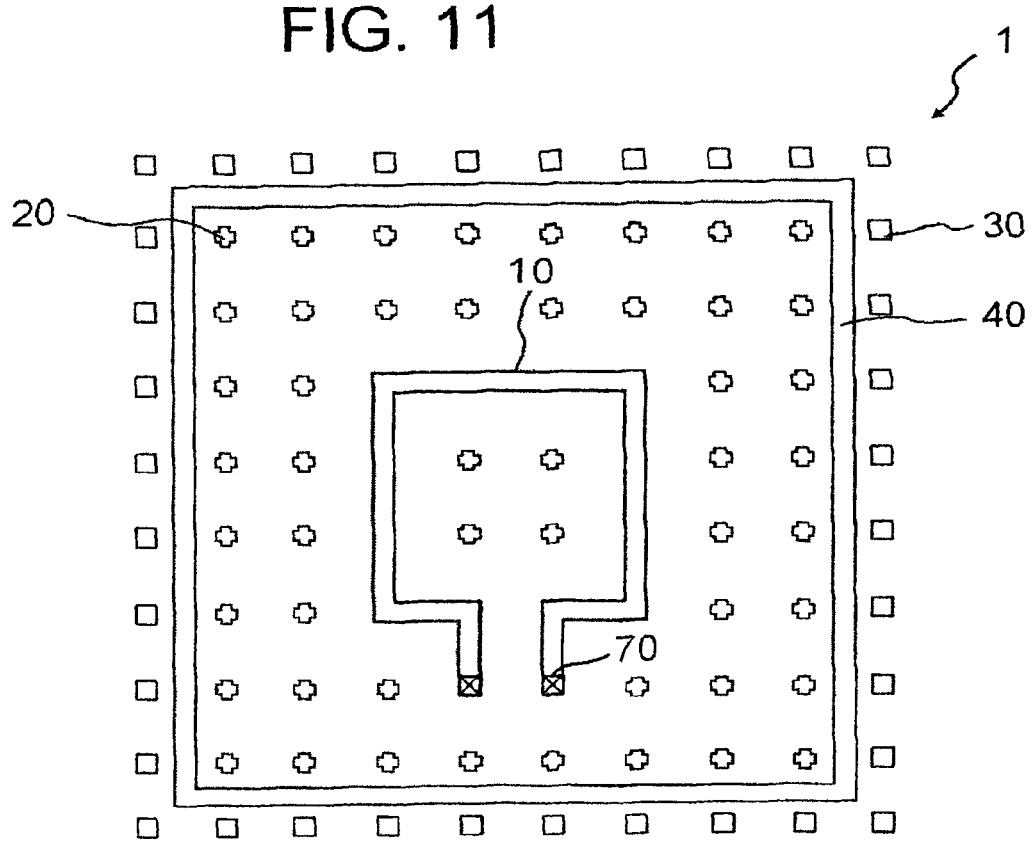
FIG. 11 is a plan view showing a semiconductor device according to a modified embodiment of the present invention.

Moreover, when the inductor comprising wiring 10 is enclosed with a guard ring wiring 40 as shown in FIG. 11, above-mentioned rectangular dummy conductor pattern 30 may be disposed outside of the guard ring wiring 40, and above-mentioned dummy conductor pattern 20 that considers the decrease of eddy current may be disposed inside of the guard ring wiring 40. In FIG. 11, the inductor comprising wiring 10 is electrically connected with lower wiring through via 70. The guard ring wiring 40 is used to stabilize the potential of the semiconductor substrate (not shown in the figure) bellow the inductor, and the guard ring wiring 40 is electrically connected with the semiconductor substrate through a via (not shown in the figure) and lower wiring (not shown in the figure).

Figure 12:
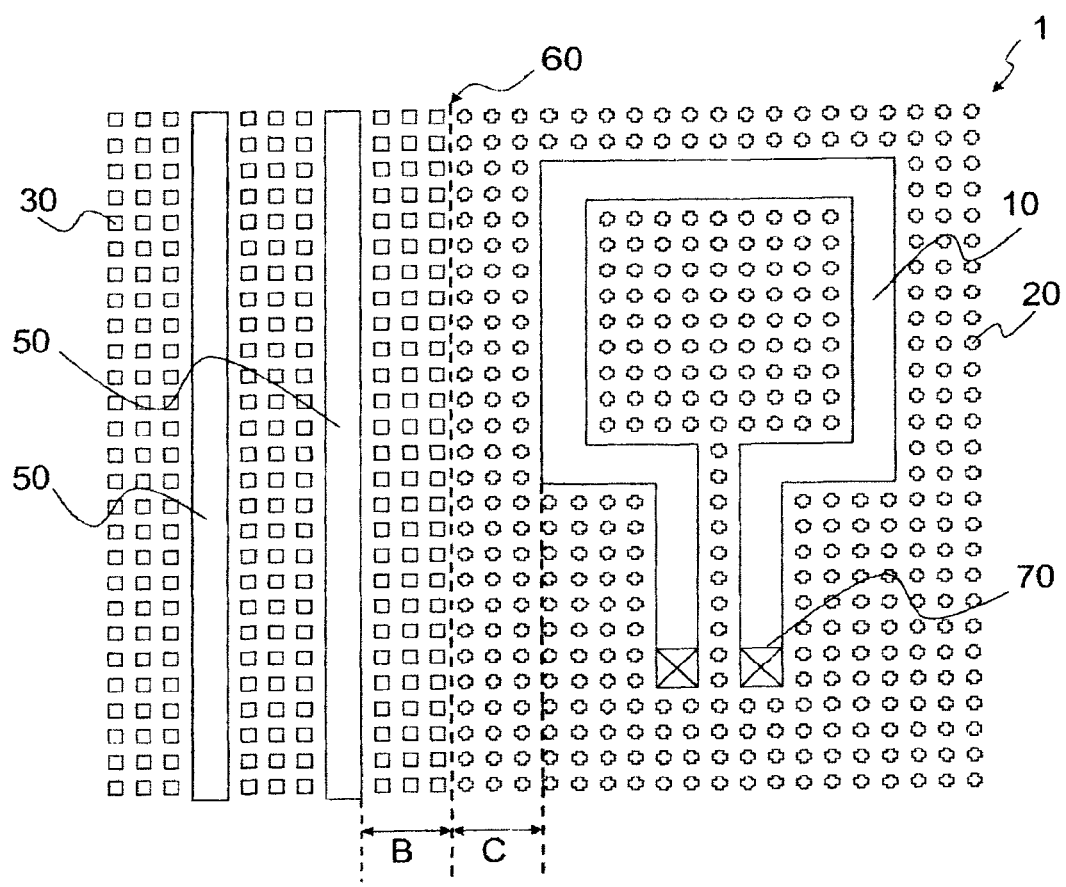
FIG. 12 is a plan view showing a semiconductor device according to another modified embodiment of the present invention.

In addition, when the inductor comprising wiring 10 is not enclosed with a guard ring wiring as shown in FIG. 12, borderline 60 is provided in case that a wiring 50 which is not connected with the inductor comprising wiring 10 passes near the inductor comprising wiring 10, and above-mentioned rectangular dummy conductor pattern 30 may be disposed on wiring 50 sides from borderline 60, and above-mentioned dummy conductor pattern 20 may be disposed on wiring 10 sides from borderline 60. In FIG. 12, the inductor comprising wiring 10 is electrically connected with lower wiring through via 70. It is desirable to set distance B (referring to FIG. 12) from wiring 50 to borderline 60 equally as distance C (Refer to FIG. 12) from the inductor comprising wiring 10 to borderline 60.

The invention claimed is:

1. A semiconductor device, comprising:
an inductor;
a plurality of first dummy conductor patterns arranged regularly in a first region; and
a plurality of second dummy conductor patterns arranged regularly in a second region far from the inductor as compared with the first region,
wherein the inductor, the first dummy conductor patterns and the second dummy conductor patterns are formed in the same layer,
wherein a planar shape the first dummy conductor pattern is different from a planar shape the second dummy conductor pattern.

2. The semiconductor device according to claim 1,
wherein the first region is arranged in an outer region of the inductor, and
wherein the second region is arranged, in the outer region of the inductor, far from the inductor as compared with the first region.

3. The semiconductor device according to claim 1,
wherein the planar shape the first dummy conductor pattern is smaller than the planar shape the second dummy conductor pattern.

4. The semiconductor device according to claim 1,
wherein the first region is arranged in an inner region of the inductor, and
wherein the second region is arranged, in an outer region of the inductor.

5. The semiconductor device according to claim 1,
wherein a high frequency signal flows through the inductor.

6. The semiconductor device according to claim 5,
wherein a frequency signal having a frequency of 5 GHz or higher flows through the inductor.

7. The semiconductor device according to claim 1,
wherein the first dummy patterns are arranged in a matrix state.

8. The semiconductor device according to claim 1,
wherein the second dummy patterns are arranged in a matrix state.

9. The semiconductor device according to claim 1,
wherein a data ratio in the first region where the first dummy conductor patterns are located is smaller than a data ratio in the second region where the second dummy conductor patterns are located.

* * * * *